United States Patent [19]

Lusch

[11] 4,222,120
[45] Sep. 9, 1980

[54] TUNING POSITION DISPLAY SYSTEM

[75] Inventor: Johann Lusch, Zurich, Switzerland

[73] Assignee: RCA Corportion, New York, N.Y.

[21] Appl. No.: 925,242

[22] Filed: Jul. 17, 1978

[30] Foreign Application Priority Data

Aug. 8, 1977 [GB] United Kingdom ............... 33212/77

[51] Int. Cl.³ .............................................. H04B 1/06
[52] U.S. Cl. ....................................... 455/154; 334/86
[58] Field of Search ................... 325/455, 325; 334/86, 334/87; 116/241, 242, 255, 256, 257

[56] References Cited

U.S. PATENT DOCUMENTS

| 3,714,585 | 1/1973 | Koch | 325/468 |
|---|---|---|---|
| 3,753,119 | 8/1973 | Close | 325/455 |
| 3,986,154 | 10/1976 | Yamada et al. | 325/464 |
| 4,039,956 | 8/1977 | Shimanek | 325/455 |

FOREIGN PATENT DOCUMENTS

| 2362853 | 6/1975 | Fed. Rep. of Germany | 325/455 |
|---|---|---|---|
| 2457405 | 10/1976 | Fed. Rep. of Germany | 325/455 |
| 2629606 | 5/1978 | Fed. Rep. of Germany | 325/455 |
| 2254910 | 11/1975 | France | 325/455 |
| 556641 | 10/1943 | United Kingdom | 325/455 |
| 1468292 | 2/1977 | United Kingdom | 325/455 |
| 1485810 | 9/1977 | United Kingdom | 325/455 |

OTHER PUBLICATIONS

Braun Hi-Fi Neuheiton '78, Braun High Fiderity, Jul. 1978.
UKW-Rundfunksender in Mieteleuropa-Stand, Jul. 1974, Funkchau 1974, Heft 17, pp. 655-657.
Korting Kundendienstanweisung Service Instructions, Music-Center 685, Korting Radio Werke, 12/77.
Eumig-High Concert Fidelity, Eumig, Aug. 1977.

Primary Examiner—Robert L. Richardson
Assistant Examiner—Tommy P. Chin
Attorney, Agent, or Firm—Paul J. Rasmussen; Allen LeRoy Limberg; Peter M. Emanuel

[57] ABSTRACT

A display system for indicating the tuning positions of a tuner for tuning a receiver to any one of a relatively large number of stations includes a plurality of station indicators arranged in a linear array and two position indicators. When a station indicator is activated, it identifies that one station in a respective group of stations including a center and two adjacent stations having respective frequencies below and above the frequency of the center station is tuned. When one position indicator is activated it identifies that the lower adjacent station in a respective group is tuned. When the other position indicator is activated, it identifies that the upper adjacent station in the respective group is tuned. When neither position indicator is activated, the center station in the respective group is tuned.

9 Claims, 2 Drawing Figures

TUNING POSITION DISPLAY SYSTEM

ENVIRONMENT OF THE INVENTION

The present invention relates to tuning position display systems.

Conventional mechanical tuners for radio receivers and the like typically include mechanical apparatus such as a movable pointer for identifying the tuning position. Such mechanical tuning position systems tend to be inaccurate.

More recently introduced electronic tuners employ a digital display for displaying the frequencies associated with selected stations. While these digital tuning position systems are much more accurate than their mechanical counterparts, they typically display as many as four digits. As a result, it may be difficult for a user to remember favorite stations. In addition, these digital tuning position systems tend to consume more power and be more expensive than mechanical tuning position systems. More importantly perhaps is the concern by manufacturers that some users may prefer a logging type of tuning position system, such as the mechanical ones, which indicate consecutive stations along a scale or the like.

Electronic types of tuning position systems which simulate the mechanical types of logging are of course known. These typically include a plurality of indicators such as light emitting diodes along a scale calibrated in frequency or station number. Unfortunately, for tuning applications where the number of stations is large, such systems would require a large number of indicators (e.g., equal to the number of stations) when accuracy is of concern. For example, in Europe there are approximately 168 FM stations. Therefore, to indicate each of these stations, 168 indicators would be required. Of course, fewer indicators could be used if accuracy were sacrificed.

SUMMARY OF THE INVENTION

A tuning system includes a plurality of station indicators (e.g., a light emitting diode) each for identifying when any station within a respective group of stations is tuned and at least one position indicator (e.g., also a light emitting diode) for identifying the relative frequency location of the specific station within the group which is tuned. For example, such a tuning system may include an indicator for indicating when any station within a respective group of stations including a center station and two adjacent stations is tuned, a minus indicator for indicating when the tuned station is below the center station in the respective group, and a plus indicator for indicating when the tuned station is above the center station.

DETAILED DESCRIPTION OF THE DRAWING

The present tuning position display apparatus will be described, by way of example, with reference to standard European FM radio broadcast frequencies. It will be appreciated, however, that similar tuning position display apparatus can be employed with other broadcast frequencies.

Prior to 1962, there were approximately 56 European FM broadcast frequencies spaced apart from one another by 300 KHz. Presently, in Europe, there are approximately 168 (i.e., 3×56) FM broadcast frequencies spaced apart from one another by 100 KHz in the range between 87.2 and 103.9 MHz. Specifically, pairs of FM broadcast frequencies assigned after 1962 were added around each of the FM broadcast frequencies assigned before 1962 so that one of the post-1962 frequencies in each pair is 100 KHz below the respective pre-1962 frequency and the other one in the pair is 100 KHz above the pre-1962 frequency. The frequencies are sometimes identified by station or channel numbers related to associated pre-1962 channel numbers. For example, the FM broadcast frequency of 93.3 MHz is identified as channel $21^0$, the "0" indicating that it is a pre-1962 frequency; the frequency of 93.2 MHz is identified as channel $21^-$, the "−" (minus) indicating that it is 100 KHz below the frequency of pre-1962 channel $21^0$; and the frequency of 93.4 MHz is identified as channel $21^+$, the "+" (plus) indicating that it is 100 KHz above the frequency of pre-1962 channel $21^0$. An article entitled, "UKW-Runfunksender in Mitteleuropa" appearing in German language magazine Funkschau, 1974, Heft 17 (hereby incorporated by reference), sets forth various FM broadcast frequencies in central Europe and the associated channel identification numbers.

Figure 1:
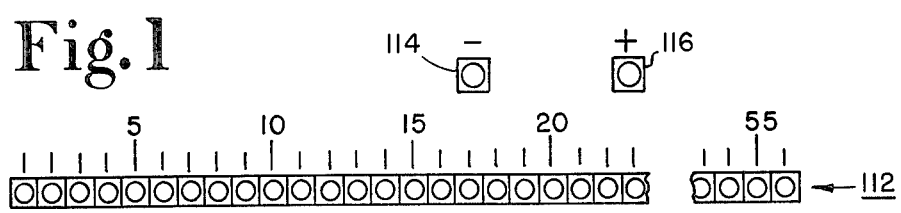
FIG. 1 shows a tuning position display apparatus constructed in accordance with the present invention.

The logging type of station position display system shown in FIG. 1 is arranged to accurately identify each of 168 European FM broadcast stations with only 58 light indicators which may, for example, be light emitting diodes (LEDs). It includes a linear array 112 of 56 LEDs having a scale with corresponding station indices and two additional LEDs 114 and 116 labelled "−" and "+", respectively. In operation, if the station $3^-$ having a frequency of 87.8 MHz were tuned, the third LED in array 112 and LED 114 would be illuminated; if the station $3^0$ having a frequency of 87.9 MHz were tuned, only the third LED in array 112 would be illuminated; and if the station $3^+$ were tuned, the third LED in array 112 and LED 116 would be illuminated.

Although the type of tuning position display system shown in FIG. 1 is most appropriate for displaying tuning positions identified in a manner similar to the manner in which European FM broadcast stations are identified, i.e., with newer stations being identified with respect to older stations, it is generally useful where there are a large number of tuning positions. For example, it is possible to utilize the logging type of tuning display system shown in FIG. 1 to indicate the tuning of any of the 82 television channels between 2 and 83 employed in the United States. In such an arrangement, for example, 28 LEDs could include 27 station indicator LEDs in a linear array similar to array 112 with a corresponding scale to identify every third channel starting with channel 3 and ending with channel 81, i.e., channels 3, 6, 9 and so on, and an additional station indicator LED in the linear array to identify channel 83, and "−" and "+" LEDs, similar to LEDS 114 and 116. In the operation of such an arrangement, if channel 2 were tuned, the first LED (i.e., the LED corresponding to channel 3) would be illuminated and the "−" LED would be illuminated; if channel 3 were tuned, only the first LED would be illuminated; and if channel 4 were tuned, the first LED and the "+" LED would be illuminated.

Figure 2:
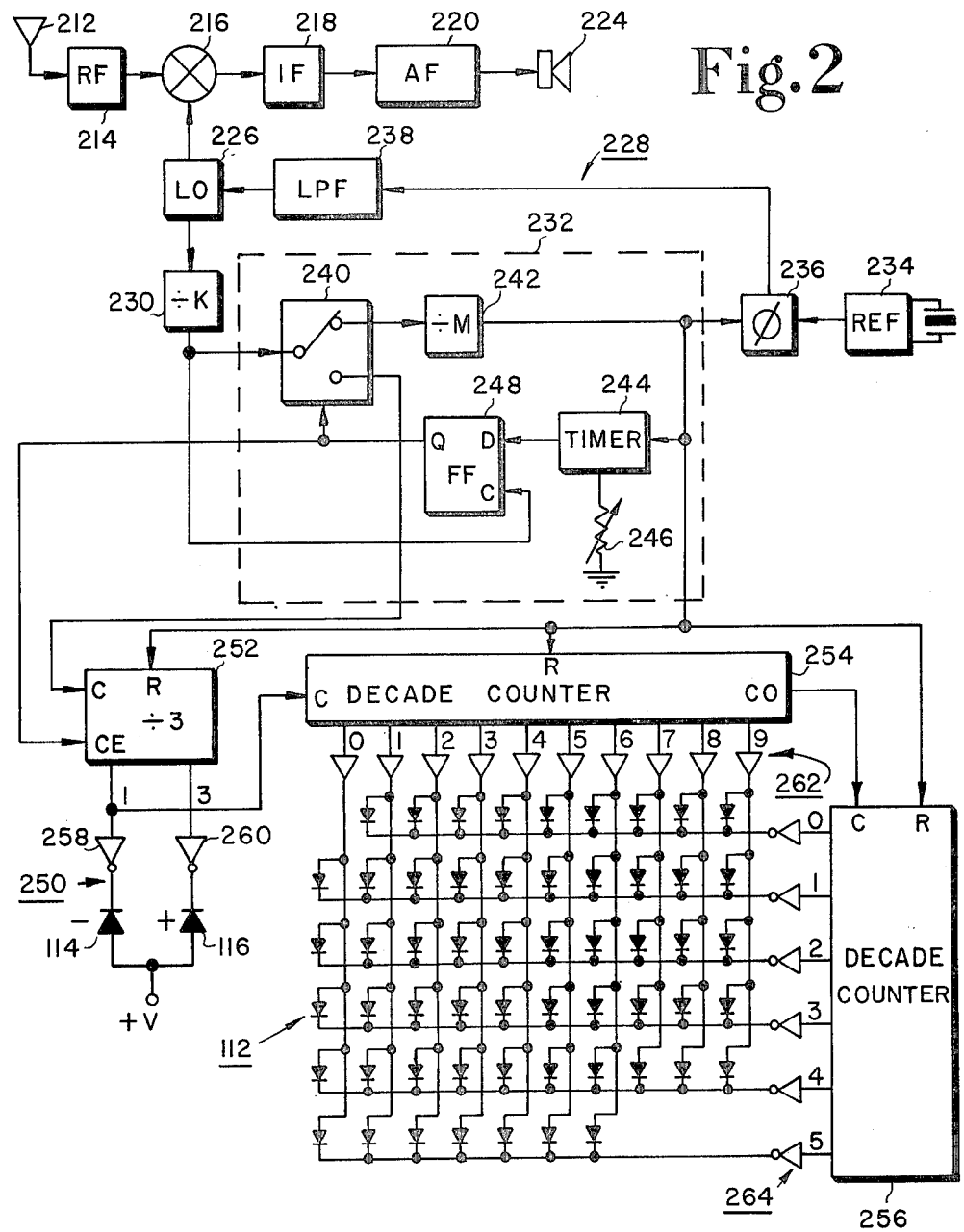
FIG. 2 shows circuitry for implementing the tuning position display apparatus in the environment of a phase locked loop tuning system.

The manner in which circuitry for the tuning position display of FIG. 1 may be illuminated in a radio receiver is shown in FIG. 2. In the receiver shown, RF carriers bearing audio information are received by an antenna 212 and coupled to an RF signal processing unit 214 where they are amplified and filtered. The processed RF carriers are coupled to a mixer 216 where they are combined with a local oscillator signal having a frequency determined by the selected station to produce an IF signal at a predetermined IF frequency, e.g., 10.7 MHz for European broadcast stations. The IF signal is coupled to an IF signal processing unit 218 where it is amplified and filtered. The IF signal is coupled to an audio frequency (AF) processing unit 220 where it is processed to derive AF signals representing audio information. The AF signals are coupled to a speaker 224.

The local oscillator signal is generated by a local oscillator 226 in response to a control voltage generated by a phase locked loop (PLL) tuning system 228. PLL tuning system 228 includes a prescaler 230 for dividing the frequency of the local oscillator signal by a predetermined factor K selected so that the output signal of prescaler 230 has a frequency which is compatible with the frequency limitations of a programmable divider 232 to which it is coupled. Programmable divider 232 divides the frequency of the output signal of prescaler 230 by a number N determined by the selected station. The output signal of programmable divider 232 and a reference frequency signal generated by a crystal controlled reference frequency unit 234 are coupled to a phase ($\phi$) comparator 236. Phase comparator 236 generates an error signal representing the phase and frequency deviation between its two input signals. The error signal is filtered by a low pass filter 238 to derive the control voltage for local oscillator 226.

The control voltage is altered until the output signals of programmable divider 232 and reference frequency unit 234 have substantially the same frequency. At this point, the frequency of the local oscillator signal $f_{LO}$ is related to the frequency of the reference frequency signal $f_{REF}$ by the following relationship:

$$f_{LO} = KNf_{REF} \tag{1}$$

For European broadcast stations, the frequency range of the local oscillator signal extends from 97.9 MHz to 114.6 MHz. Accordingly, suitable choices for $f_{REF}$, K and N are:

$f_{REF} = 1$ KHz
$K = 100$
$N = 979$ to 1146

Programmable divider 232 is similar to the programmable divider described in U.S. Pat. No. 4,097,810 issued June 27, 1978 in the name of Felix Aschwanden, hereby incorporated by reference. Specifically, programmable divider 232 includes an input switch 240 for selectively coupling the output signal of prescaler 230 to a divider 242. Divider 242 divides the frequency of the signal coupled to it by a fixed factor M so that after each M pulses of the input signal of divider 242, divider 242 generates a pulse. A timing control circuit including a timer 244, potentiometer 246 and data (D) type flip-flop (FF) 248 controls the operation of input switch 240. Depending on the time duration of a low level signal generated at the Q output of D FF 248 in response to each output pulse of divider 242, a number X of pulses of the output signal of prescaler 230 are decoupled from the input of divider 242. As a result, for every $N = X + M$ pulses of the output signal of prescaler 230, one pulse is generated at the output of divider 242. For the values of N set forth above, suitable choices for M and X are:

$M = 978$
$X = 1$ to 173

Specifically, the time duration of the low level signal at the Q output of D FF 248 is adjusted by adjusting the time constant of timer 244 comprising, for example, a monostable multivibrator, by means of station tuning potentiometer 246. D FF 248 is interposed between the output of timer 244 and the control terminal of switch 240 and has its clock (C) input coupled to the output of prescaler 230 so that the beginning and end of the timing interval is synchronized with the output pulses of prescaler 230.

During the time interval in which the output signal of prescaler 230 is decoupled from the input of divider 242, it is coupled to a tuning display position display 250. In other words, during every cycle X pulses, X being determined by the station selected, are coupled to tuning position display 250. Tuning position display 250 includes a divide by 3 counter 252, a decade counter 254 and a decade counter 256 in addition to LEDs 114 and 116 and the LEDs in array 112 which are physically arranged in a linear array as shown in FIG. 1 and electrically arranged in a rectangular array as shown in FIG. 2.

Divide by 3 counter 252 counts to a count of 3 and then resets itself in response to sequential pulses when the output of prescaler 230 is coupled to its C input through input switch 240 and it is enabled by the application of the low level signal generated at the Q output of D FF 248 to its clock enable (CE) input. Counter 252 generates an output signal 1 when it has counted one pulse and an output signal 3 when it has counted three pulses. The output signal 1 is coupled through an inverting LED driver 258 to the cathode of LED 114 and the output signal 3 is coupled through an inverting LED driver 260 to the cathode of LED 116. The anodes of LEDs 114 and 116 are coupled to a positive supply voltage +V.

The output signal 1 of counter 252 is also coupled to the C input of decade counter 254. Decade counter 254 counts from 0 to 9 in response to successive output signal 1 pulses and thereby causes positive-going pulses to be successively coupled through respective noninverting LED drivers 262 to the anodes of the LEDs of array 112 in corresponding columns. When decade counter 254 reaches a count of nine, it generates a carryout signal at its CO output terminal. The carryout signal of decade counter 254 is coupled to the C input of decade counter 256. Decade counter 256 counts from 0 to 5 in response to successive carryout pulses and thereby causes negative-going pulses, generated by respective inverting LED drivers 264, to be successively coupled to the cathodes of the LEDs of array 112 in corresponding rows.

In operation, X determines the station tuned. The relationship between X and the various European FM stations is indicated below.

| X | Station |
|---|---|
| 1 | 1⁻ |
| 2 | 1⁰ |
| 3 | 1⁺ |
| 4 | 2⁻ |
| 5 | 2⁰ |
| 6 | 2⁺ |
| 7 | 3⁻ |
| 8 | 3⁰ |
| 9 | 3⁺ |
| 10 | 4⁻ |
| 11 | 4⁰ |
| 12 | 4⁺ |
| etc. | |

Divide by 3 counter 252 couples a pulse to the C input of decade counter 254 in response to every third pulse, starting with the first pulse, coupled to the C input of counter 252 during the interval in which the output of prescaler 230 is coupled to counter 252 through switch 240. As a result, the combination of decade counters 254 and 256 count a number of pulses equal to the respective pre-1962 station number. Decade counter 254 is associated with the units digit of the station number and enables the appropriate column of LEDs of array 112. Decade counter 256 is associated with the tens digit of the station number and enables the appropriate row of LEDs of array 112. In addition, counter 252 couples an enabling signal to "−" LED 114 in response to every third pulse coupled to it starting with the first and couples an enabling signal to "+" LED 116 in response to every third pulse coupled to it starting with the third. At the end of the divide by N cycle, when divider 242 generates an output pulse, counters 252, 254 and 256 are reset.

Thus, at the end of the interval in which the output of prescaler 230 is coupled to tuning position display 250, depending on the number of pulses X coupled to tuning position display 250 during the interval, the LED of array 112 corresponding to the pre-1962 station number (which is the station between the post-1962 stations as described above) and either "−" LED 114 or "+" LED 116, depending on whether the tuned station is below or above, respectively, the corresponding pre-1962 station, are illuminated. By way of example, if station 3⁻ is tuned, seven pulses are coupled to counter 252 and three pulses are coupled to decade counter 254. As a result, the first row of LEDs and the third column of LEDs are enabled and the LED corresponding to station number 3 (i.e., the third LED of linear array 112 of FIG. 1) is illuminated. In addition, the seventh pulse coupled to counter 252 causes "−" LED 114 to be illuminated.

While the present tuning position display system has been described in terms of a tuning system arranged to tune a receiver to uniformly spaced carriers not separated in bands, it will be appreciated that it is also useful in tuning systems arranged to tune carriers which are separated in bands such as tuning systems utilized in television receivers. In addition, in some applications where there are an excessively large number of tuning positions, the number of indicators in the linear array may be kept to a reasonable number by employing additional "−" and "+" indicators to indicate when a selected station is more than one station below or above a corresponding center station. These and other modifications are considered to be within the scope of the present invention as defined in the following claims.

What is claimed is:

1. Apparatus comprising:

tuner means for generating a local oscillator signal appropriate for sequentially tuning any one of a plurality of stations having successively higher frequencies;

first means including a plurality of individual station indicator means for indicating when respective predetermined ones of said stations in respective predetermined groups of stations are tuned, said indicator means being arranged in a linear array according to a numerical order of said stations corresponding to the order of the frequencies of said stations along a scale with respective identifying indices so that as stations in said respective groups are sequentially tuned said respective indicator means are sequentially activated; and second means including at least one position indicator means for indicating the frequency of a tuned station relative to the frequency of the respective predetermined station within said respective predetermined group.

2. The apparatus recited in claim 1 wherein:

said first and second means includes first and second counter means, respectively;

said tuner means includes gating means for selectively coupling a number of cycles of said local oscillator signal proportional to the number of a tuned station between the first station and the last station in said plurality of station to said second counter means;

said second counter means being responsive to said signal coupled to it by said gating means for dividing its frequency by a number equal to the number of stations in said predetermined groups to generate first and second position identifying signals, said second position identifying signal being coupled to said position indicator means to activate it, said first position identifying signal being coupled to said first counter means;

said first counter means being responsive to said first position identifying signal to generate a plurality of station identifying signals representing the number of counts accumulated by said first counter means, ones of said station identifying signals representing particular counts being coupled to respective ones of said station indicator means to activate said station indicator means in said numerical order.

3. The apparatus recited in claim 1 wherein:

each of said groups of stations includes a center station having a frequency between the frequencies of at least two adjacent stations; and said second means includes a first position indicator means for indicating when the tuned station is the adjacent station having a frequency lower than the frequency of the center station, and a second position indicator means for indicating when the tuned station is the adjacent station having a frequency higher than the frequency of the center station.

4. The apparatus recited in claim 3 wherein:

said first and second means include first and second counter means, respectively;

said tuner means includes gating means for selectively coupling a number of cycles of said local oscillator signal equal to the number of a tuned station between the first station and the last station in said plurality of stations to said second counter means;

said second counter means being responsive to said signal coupled to it by said gating means for dividing its frequency by a number n equal the number of stations in said predetermined group to generate first and second position identifying signals, said first position identifying signal being generated at a first count and said second position identifying signal being generated at a second count occurring n−1 counts after said first count, said first position identifying signals being coupled to said first position indicator means to activate it, said second position identifying signal being coupled to said second position identifying means to activate it, said first position identifying signal being coupled to said first counter means;

said first counter means being responsive to said first position identifying signal to generate a plurality of station identifying signals representing the number of counts accumulated by said first counter means, ones of said station identifying signals representing particular counts being coupled to respective ones of said station indicator means to activate said station indicator means in said numerical order.

5. The apparatus recited in claim 4 wherein:

said first counter means includes first and second decimal counter means each for generating decimal signals representing respective decimal digits, said first decimal counter being responsive to said first position identifying signal for sequentially generating decimal digit signals in a first group respectively representing the decimal digits between 0 and 9, said second decimal counter means being responsive to the generation of the decimal digit signal in said first group representing the decimal digit 9 to sequentially generate decimal digit signals in a second group respectively representing the decimal digits between 0 and D where D is a decimal digit between 1 and 9; and each one of said station indicator means are activated responsive to one decimal digit signal of said first group and one decimal digit signal of said second group.

6. The apparatus recited in claim 5 wherein:

each of said indicator means includes illumination means for emitting light when activated.

7. The apparatus recited in claim 6 wherein:

each of said illumination means includes a light emitting diode.

8. The apparatus recited in claim 4 wherein:

said number n is equal to 3.

9. The apparatus recited in claim 3 wherein:

said first position indicator means is labelled with the symbol "−"; and said second position indicator means is labelled with the symbol "+".

* * * * *